(12) United States Patent
Lee et al.

(10) Patent No.: US 10,777,412 B2
(45) Date of Patent: Sep. 15, 2020

(54) HARDMASK COMPOSITION, METHOD OF PREPARING THE SAME, AND METHOD OF FORMING PATTERNED LAYER BY USING THE HARDMASK COMPOSITION

(71) Applicant: Samsung Electronics Co., Ltd., Suwon-si, Gyeonggi-do (KR)

(72) Inventors: Dongwook Lee, Suwon-si (KR); Sangwon Kim, Seoul (KR); Minsu Seol, Suwon-si (KR); Seongjun Park, Seoul (KR); Hyeonjin Shin, Suwon-si (KR); Yunseong Lee, Osan-si (KR); Seongjun Jeong, Hwaseong-si (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 15/874,226

(22) Filed: Jan. 18, 2018

(65) Prior Publication Data

US 2019/0019675 A1    Jan. 17, 2019

(30) Foreign Application Priority Data

Jul. 14, 2017    (KR) .......................... 10-2017-0089672

(51) Int. Cl.
*H01L 21/00* (2006.01)
*H01B 1/00* (2006.01)
(Continued)

(52) U.S. Cl.
CPC ........ *H01L 21/0332* (2013.01); *C01B 32/194* (2017.08); *G03F 7/094* (2013.01);
(Continued)

(58) Field of Classification Search
CPC ... H01B 1/00; H01B 1/04; H01B 1/24; C09D 5/24; G03F 7/00; G03F 7/09; G03F 7/11; H01L 21/00
See application file for complete search history.

(56) References Cited

U.S. PATENT DOCUMENTS

| 6,827,823 B2 | 12/2004 | Takikawa et al. |
| 8,524,851 B2 | 9/2013 | Kim et al. |

(Continued)

FOREIGN PATENT DOCUMENTS

| CN | 106744857 | * | 5/2017 |
| CN | 106744857 A |   | 5/2017 |

(Continued)

OTHER PUBLICATIONS

Bai et al "Graphene-inorganic nanocomposites", RSC Advances, 2012, 2, 64-98.*

(Continued)

*Primary Examiner* — Mark Kopec
(74) *Attorney, Agent, or Firm* — Harness, Dickey & Pierce, P.L.C.

(57) ABSTRACT

Provided are a hardmask composition, a method of preparing the same, and a method of forming a patterned layer using the hardmask composition. The hardmask composition may include graphene quantum dots, a metal compound, and a solvent. The metal compound may be chemically bonded (e.g., covalently bonded) to the graphene quantum dots. The metal compound may include a metal oxide. The metal oxide may include at least one of zirconium (Zr) oxide, titanium (Ti) oxide, tungsten (W) oxide, or aluminum (Al) oxide. The graphene quantum dots may be bonded to the metal compound by an M—O—C bond or an M—C bond, where M is a metal element, O is oxygen, and C is carbon.

27 Claims, 11 Drawing Sheets

(51) Int. Cl.
*H01L 21/033* (2006.01)
*G03F 7/11* (2006.01)
*G03F 7/09* (2006.01)
*H01B 1/04* (2006.01)
*C01B 32/194* (2017.01)
*H01L 21/311* (2006.01)
*B82Y 30/00* (2011.01)
*B82Y 40/00* (2011.01)

(52) U.S. Cl.
CPC .............. *G03F 7/11* (2013.01); *H01B 1/04* (2013.01); *H01L 21/0337* (2013.01); *H01L 21/31144* (2013.01); *B82Y 30/00* (2013.01); *B82Y 40/00* (2013.01); *Y10S 977/734* (2013.01); *Y10S 977/847* (2013.01)

(56) References Cited

U.S. PATENT DOCUMENTS

| | | | |
|---|---|---|---|
| 9,287,518 B2* | 3/2016 | Lee | H01L 51/5012 |
| 9,905,422 B2* | 2/2018 | Shin | H01L 21/0332 |
| 10,424,490 B2* | 9/2019 | Kim | C01B 32/184 |
| 2008/0194073 A1 | 8/2008 | Park | |
| 2014/0219906 A1 | 8/2014 | Kim et al. | |
| 2014/0302439 A1 | 10/2014 | Shim et al. | |
| 2015/0118143 A1 | 4/2015 | Jeon et al. | |
| 2016/0291472 A1 | 10/2016 | Shin et al. | |
| 2019/0031906 A1* | 1/2019 | Kim | C09D 165/00 |
| 2019/0035635 A1* | 1/2019 | Kim | H01L 21/0332 |
| 2019/0276736 A1* | 9/2019 | Choi | C09K 11/54 |

FOREIGN PATENT DOCUMENTS

| | | |
|---|---|---|
| EP | 3076239 A1 | 10/2016 |
| JP | 5756134 B2 | 7/2015 |
| KR | 20150041887 A | 4/2015 |
| KR | 0664347 B1 | 8/2016 |
| KR | 20160118782 A | 10/2016 |
| WO | WO-2013/100365 A1 | 7/2013 |
| WO | WO-2014104496 A1 | 7/2014 |
| WO | WO-2016129927 A1 | 8/2016 |

OTHER PUBLICATIONS

Son et al "Emissive ZnO-graphene quantum dots for white light emitting diodes", Nature Nanotechnology col. 7, Jul. 2012, 465-71.*
Chan et al "A visible-light-driven composite photocatalyst of TiO2 nanotube arrays and graphene quantum dots", Beilstein Journal of Nanotechnology, 2014, 5, 689-95.*
Pan et al "Efficient separation of electron-hole pairs ion graphene quantum dots . . . ", ACS Sustainable Chem. Eng. 2015, 3, 2405-2413.*
Jayanthi et al "Graphene Quantum Dot—titania nanoparticle composite for photocatalytic water splitting", MRS Advances 2016 DOI: 10.1557/adv.2016.470.*
Sun et al "Synthesis of ZnO quantum dot/graphene nanocomposites . . . ", Journal of Materials Chemistry A, 2014, 2, 7319.*
Polymer Science and Technology vol. 20, No. 5, Dated Oct. 2009. pp. 472-480.
Shuxue Zhou, Georg Garnweitner, Markus Niederberger, amd Markus Antoietti. Dispersion Behavior of Zirconia Nanocrystals and Their Surface Functionalization with Vinyl Group-Containing Ligands. Dated May 21, 2007 pp. 9178-9187, (No English translation).
Extended European Search Report dated Mar. 6, 2018 issued in corresponding European Application No. 17207062.5.

* cited by examiner

< Comparative Example >

HARDMASK COMPOSITION, METHOD OF PREPARING THE SAME, AND METHOD OF FORMING PATTERNED LAYER BY USING THE HARDMASK COMPOSITION

CROSS-REFERENCE TO RELATED APPLICATION

This application claims the benefit of Korean Patent Application No. 10-2017-0089672, filed on Jul. 14, 2017, in the Korean Intellectual Property Office, the disclosure of which is incorporated herein in its entirety by reference.

BACKGROUND

1. Field

The present disclosure relates to a hardmask composition, a method of preparing the same, and a method of forming a patterned layer (and/or electronic device) using the hardmask composition.

2. Description of Related Art

Generally, a lithography process includes forming a material layer on a semiconductor substrate, coating a photoresist on the material layer, patterning the photoresist into a photoresist pattern is formed by exposing and developing the photoresist, and then etching the material layer while using the photoresist pattern as a mask. The lithography process is a fundamental process for manufacturing semiconductor devices/electronic devices.

However, by using only a photoresist pattern, it may be difficult to form a patterned layer having a large aspect ratio and a small line width. Accordingly, below the photoresist pattern, a material layer called a 'hardmask', of which rigidity is greater than that of the photoresist pattern, may be applied. Currently, an amorphous carbon layer (ACL) may be used as a hardmask. However, even if an ACL is used as a hardmask, it may not be easy to obtain an ultrafine pattern having a line width of several tens of nanometers or less. At this time, the ultrafine pattern of the etching layer may collapse (e.g., fall down or tilt), and an edge portion of the pattern may not be precisely formed as desired.

Therefore, in order to implement a fine/ultra-fine pattern having a high aspect ratio and a line width less than several tens of nanometers, other hardmask materials are being developed.

SUMMARY

Provided are compositions capable of producing a hardmask having excellent etching resistance.

Provided are compositions capable of producing a hardmask that is suitable for forming a pattern layer having a high aspect ratio.

Provided are compositions capable of producing a hardmask which is suitable for forming a fine pattern and/or an ultrafine pattern.

Provided are methods of manufacturing and/or preparing compositions (e.g., hardmask compositions).

Provided are hardmasks formed by using the hardmask compositions.

Provided are methods of patterning a material layer using the hardmask compositions.

Additional aspects will be set forth in part in the description which follows and, in part, will be apparent from the description, or may be learned by practice of the presented embodiments.

According to some example embodiments, a hardmask composition may include graphene quantum dots; a metal compound chemically bonded to the graphene quantum dots; and a solvent.

In some example embodiments, the metal compound may include a metal oxide.

In some example embodiments, the metal oxide may include at least one of zirconium (Zr) oxide, titanium (Ti) oxide, tungsten (W) oxide, or aluminum (Al) oxide.

In some example embodiments, the graphene quantum dots may be covalently bonded to the metal compound.

In some example embodiments, the graphene quantum dots may be bonded to the metal compound by an M—O—C bond or an M—C bond, where M is a metal element, O is oxygen, and C is carbon.

In some example embodiments, the graphene quantum dots may have a size of greater than 0 nm and less than or equal to about 10 nm.

In some example embodiments, the metal compound may have a form of nanoparticles.

In some example embodiments, the metal compound has the form of nanoparticles, the nanoparticles may each have a size of greater than 0 nm and less than or equal to about 2 nm.

In some example embodiments, an amount of the metal compound may be greater than 0 wt % and less than or equal to about 10 wt % based on a total weight of the graphene quantum dots and the metal compound.

In some example embodiments, the solvent may include an organic solvent.

In some example embodiments, the solvent may be a non-aqueous solvent.

In some example embodiments, the organic solvent may include at least one of N-methylpyrrolidone (NMP), dimethylformamide (DMF), tetrahydrofuran (THF), or propylene glycol methyl ether acetate (PGMEA).

According to some example embodiments, a method of forming a patterned layer may include forming a hardmask pattern on a substrate and forming a patterned layer. The forming the hardmask pattern may include providing the hardmask composition described above on the substrate, forming a hardmask from the hardmask composition, forming a patterned resist film on the hardmask, forming a hardmask pattern by etching the hardmask by using the patterned resist film as an etching mask. The substrate may include an etch target portion. The forming the patterned layer may include etching the etch target portion of the substrate by using the hardmask pattern as an etch mask.

In some example embodiments, the forming the hardmask pattern may include one of spin coating, screen printing, doctor-blade processing, spray coating, electrospray, dip coating, or bar coating to provide the hardmask composition on the substrate.

In some example embodiments, the forming the hardmask pattern may include, heat treating the hardmask composition at a temperature of greater than 0° C. and less than or equal to 500° C. after the providing the hardmask composition on the substrate.

In some example embodiments, the hardmask may have a thickness of about 10 nm to about 500 nm.

In some example embodiments, the hardmask may be an electrically insulating layer.

According to some example embodiments, a method of preparing a hardmask composition may include adding graphene quantum dots and a precursor of a metal compound to a solvent; and forming, from the precursor in the solvent, a metal compound chemically bonded to the graphene quantum dots.

In some example embodiments, before the forming the metal compound chemically bonded to the graphene quantum dots, a carbon content of the graphene quantum dots may be in a range of about 50 at % to about 80 at %.

In some example embodiments, before the forming the metal compound chemically bonded to the graphene quantum dots, the graphene quantum dots may each include at least one of an OH group or a COOH group as a functional group on a surface thereof.

In some example embodiments, the precursor of the metal compound may include at least one of metal alkoxide, a metal chloride, or a metal chloride hydrate.

In some example embodiments, the metal compound may include a metal oxide.

In some example embodiments, the graphene quantum dots may be bonded to the metal compound by an M—O—C bond or an M—C bond, where M is a metal element, O is oxygen, and C is carbon.

In some example embodiments, the solvent may be a non-aqueous solvent including an organic solvent.

In some example embodiments, the organic solvent may include at least one of N-methylpyrrolidone (NMP), dimethylformamide (DMF), tetrahydrofuran (THF), or propylene glycol methyl ether acetate (PGMEA).

According to some example embodiments, a hardmask may be manufactured by the above-discussed method. The hardmask composition may include the solvent and the metal compound chemically bonded to the graphene quantum dots. The solvent may be a non-aqueous solvent including an organic solvent.

In some example embodiments, the graphene quantum dots may be bonded to the metal compound by an M—O—C bond or an M—C bond, where M is a metal element, O is oxygen, and C is carbon.

In some example embodiments, the precursor of the metal compound may include at least one of metal alkoxide, a metal chloride, or a metal chloride hydrate.

In some example embodiments, the graphene quantum dots may have a size of greater than 0 nm and less than or equal to about 10 nm.

In some example embodiments, the graphene quantum dots may have a size of greater than 0 nm and less than or equal to about 10 nm.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
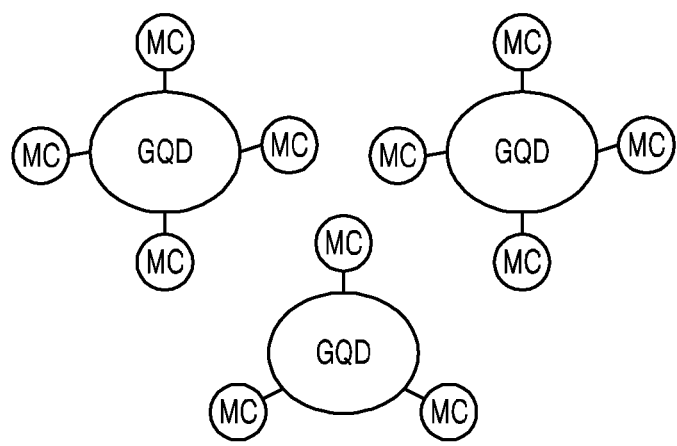
FIG. 1 shows a conceptual diagram illustrating a hardmask composition according to some example embodiments.

Reference will now be made in detail to some example embodiments, which are illustrated in the accompanying drawings, wherein like reference numerals refer to like elements throughout. In this regard, example embodiments may have different forms and should not be construed as being limited to the descriptions set forth herein. Accordingly inventive concepts are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a hardmask composition according to some example embodiments and a method of manufacturing the same, a hardmask formed from the hardmask composition, and a method of patterning a material layer by using the hardmask composition will be described in detail with reference to the accompanying drawings. The width and thickness of the layers or regions illustrated in the accompanying drawings may be somewhat exaggerated for clarity and ease of description. Like reference numerals designate like elements throughout the specification.

FIG. 1 shows a conceptual diagram illustrating a hardmask composition according to some example embodiments.

Referring to FIG. 1, the hardmask composition may include a graphene quantum dot GQD, a metal compound MC chemically bonded to the graphene quantum dot GQD, and a solvent (not shown). Although not illustrated, in some example embodiments, more than one different metal compound may be chemically bonded to the graphene quantum dot GQD.

The graphene quantum dot GQD may have a size greater than 0 nm and less than or equal to about 10 nm. The graphene quantum dot GQD may have an average particle diameter (or average length) of greater than 0 nm and about 10 nm or less or about 6 nm or less. The graphene quantum dot GQD may include 'a carbon nanostructure' having an aromatic ring. Carbon atoms may form aromatic ring structures, and these ring structures (annular structures) may be arranged in a two-dimensional manner.

The metal compound MC may be chemically bonded to the graphene quantum dot GQD. The term 'chemically bonded' indicates that two subjects are combined with each other by chemical bonding, which is considered to be a concept different from that of simply being 'mixed.' The metal compound MC may be covalently bonded to the graphene quantum dot GQD. The metal compound MC may be an inorganic material. The metal compound MC may include a metal oxide. For example, the metal compound MC may include at least one of zirconium (Zr) oxide, titanium (Ti) oxide, tungsten (W) oxide, or aluminum (Al) oxide. The Zr oxide may be $ZrO_2$ or may have a composition similar thereto, the Ti oxide may be $TiO_2$ or may have a composition similar thereto, the W oxide may be $WO_3$ or may have a composition similar thereto, and the Al oxide may be $Al_2O_3$ or may have a composition similar thereto. The metal compound MC and the graphene quantum dot GQD may be bonded to each other by an M—O—C bond or an M—C bond, wherein M is a metallic element, O is oxygen, and C is carbon. Also, C may be one of the carbon atoms constituting GQD.

The metal compound MC may have the form of a nanoparticle or a nanodot or a form similar thereto. When the metal compound MC has the form of nanoparticle, the nanoparticle may have a size of greater than 0 nm and less than or equal to about 2 nm. The average diameter of nanoparticles may be about 2 nm or less or about 1 nm or less. Accordingly, the size of the nanoparticle of the metal compound MC may be much smaller than that of the graphene quantum dot GQD. The amount of the metal compound MC in the hardmask composition may be greater than 0 wt % and less than or equal to about 10 wt %, based on the total weight of the graphene quantum dot GQD and the metal compound MC. The weight ratio of the graphene quantum dot GQD to the metal compound MC may affect properties of a hardmask formed from the hardmask composition. The weight ratio may be adjusted according to a process for forming the hardmask composition.

Although not shown, a solvent mixed with the graphene quantum dot GQD and the metal compound MC is provided. The solvent may be a material that provides fluidity to the hardmask composition, and may be used to produce a hardmask composition. The solvent may include an organic solvent and may not include water ($H_2O$). In other words, the solvent may be a non-aqueous solvent including an organic solvent. The organic solvent may include, for example, at least one of N-methylpyrrolidone (NMP), dimethylformamide (DMF), tetrahydrofuran (THF), or propylene glycol methyl ether acetate (PGMEA). In such a solvent, the graphene quantum dot GQD may react with a precursor of the metal compound MC to form the metal compound MC chemically bonded to the graphene quantum dot GQD.

Since the graphene quantum dot GQD is chemically bonded to the metal compound MC, a hardmask formed from the hardmask composition including the graphene quantum dot GQD and the metal compound MC may have excellent uniformity (composition uniformity). The graphene quantum dot GQD may have a size of about 10 nm or less or about 6 nm or less, and the metal compound MC may have a size of about 2 nm or less or about 1 nm or less, but greater than 0 nm. Accordingly, from the hardmask composition including the graphene quantum dot GQD and the metal compound MC, a hardmask having a small thickness may be easily obtained, and thickness uniformity of the hardmask may be easily obtained. The metal compound MC has a high dissociation energy. Accordingly, the hardmask containing the metal compound MC may have excellent etching resistance properties.

Figure 2:
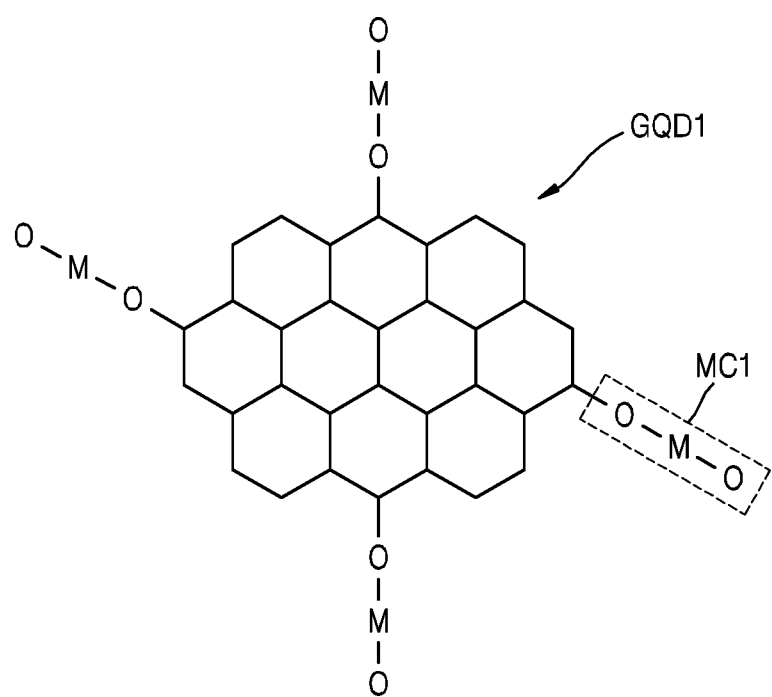
FIG. 2 shows a diagram of a chemical structure of a hardmask composition according to some example embodiments.

FIG. 2 shows a diagram of a chemical structure for explaining a hardmask composition according to some example embodiments.

Referring to FIG. 2, a graphene quantum dot GQD1 may include a 'carbon nanostructure' having an aromatic ring structure. Carbon atoms may form an aromatic ring structure, and these ring structures (annular structures) may be arranged in a two-dimensional manner to form the graphene quantum dot GQD1. A metal compound MC1 chemically bonded to the graphene quantum dot GQD1 may be provided. The metal compound MC1 may be the result obtained by reacting a precursor with a functional group of the graphene quantum dot GQD1. The metal compound MC1 may include, for example, a metal oxide. The metal compound MC1 may be bonded to the graphene quantum dot GQD1 by an M—O—C bond or an M—C bond. When an oxygen atom (O) between a metal atom (M) and a carbon atom (C) is removed from the M—O—C bond, an M—C bond may be formed. The size, shape, and structure of the graphene quantum dot GQD1 shown in FIG. 2 are examples only and may vary. In addition, the material, configuration, size, etc. of the metal compound MC1 shown in FIG. 2 are examples only and may vary.

Figure 3:
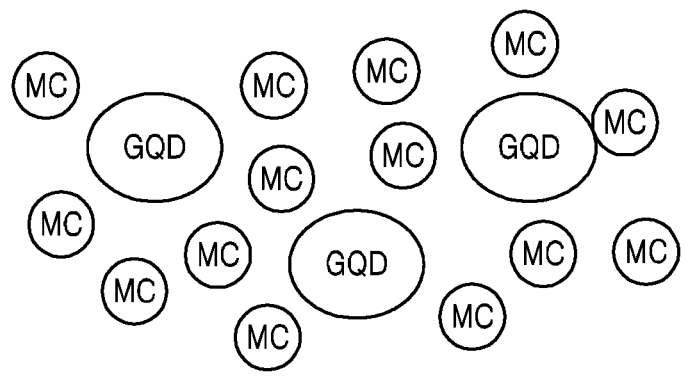
FIG. 3 shows a conceptual diagram illustrating a composition according to Comparative Example.

FIG. 3 shows a conceptual diagram illustrating a composition according to Comparative Example.

Referring to FIG. 3, a composition according to Comparative Example may include a graphene quantum dot GQD and a metal compound MC mixed therewith, and the graphene quantum dot GQD and the metal compound MC may be dispersed in a solvent (not shown). The graphene quantum dot GQD and the metal compound MC may not be chemically bonded to each other, but may simply be mixed to form a mixture. A hardmask formed from such a composition may not have good compositional uniformity. A graphene quantum dot GQD region in the hardmask may be etched relatively quickly, which may lead to etch non-uniformity problems.

Figure 4:
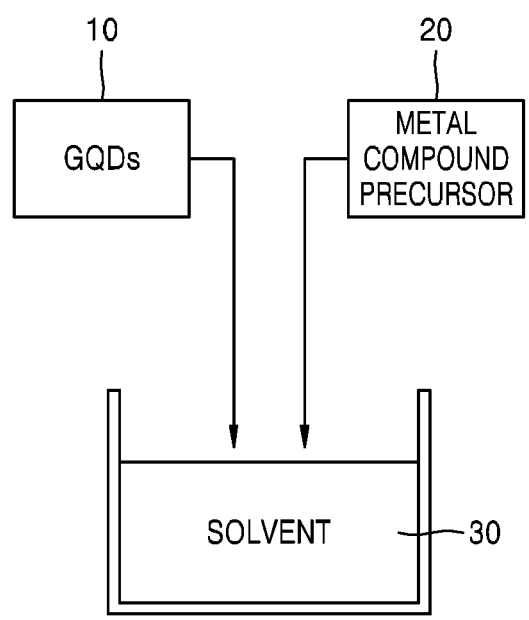
FIG. 4 shows a diagram for explaining a method of producing a hardmask composition method according to some example embodiments.

FIG. 4 shows a view for explaining a method of producing a hardmask composition method according to some example embodiments.

Referring to FIG. 4, graphene quantum dots 10 and a metal compound precursor 20 may be added to a solvent 30. First, the graphene quantum dots 10 may be dispersed in the solvent 30, and then, the metal compound precursor 20 may be added to the solvent 30.

The solvent 30 may be a non-aqueous solvent containing an organic solvent, not containing water ($H_2O$). For example, the solvent 30 may include at least one organic solvent. For example, the solvent 30 may include at least one of NMP, DMF, THF, or PGMEA. This solvent 30 may allow the graphene quantum dots 10 and the metal compound precursor 20 to disperse. In one or more embodiments, the solvent 30 may disperse and dissolve (partially) the metal compound precursor 20, while not reacting therewith. In the solvent 30, the graphene quantum dots 10 may be chemically reacted with the metal compound precursor 20. As a result, a metal compound (see MC illustrated in FIG. 1) chemically bonded to the graphene quantum dots 10 may be obtained from the metal compound precursor 20.

When the solvent 30 includes water ($H_2O$), the metal compound precursor 20 may react with the solvent 30 to form a metal compound, which is not chemically bonded to the graphene quantum dots 10. In this case, a mixture as described with reference to FIG. 3 may be formed. Even when the solvent 30 does not contain water, similar results may be obtained when the solvent 30 material reacts well with the metal compound precursor 20.

Figure 5:
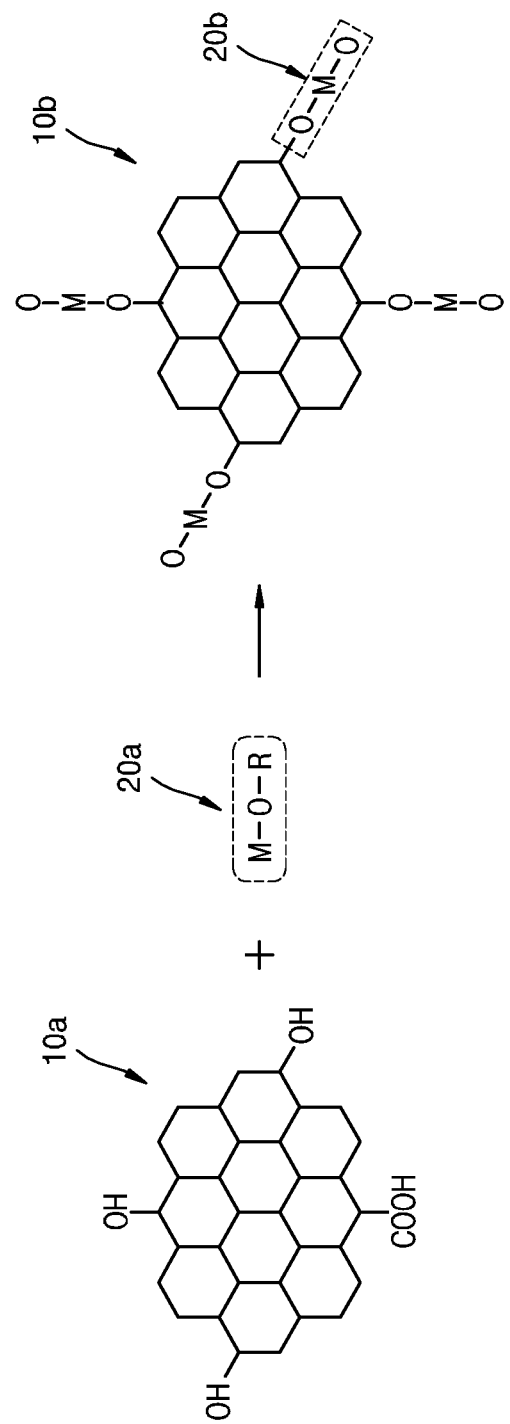
FIG. 5 shows a chemical reaction formula for illustrating a method of producing a hardmask composition according to some example embodiments.

FIG. 5 shows a chemical reaction formula for illustrating a method of preparing a hardmask composition according to some example embodiments.

Referring to FIG. 5, a graphene quantum dot 10a and a metal compound precursor 20a may be chemically reacted in a solvent. As a result, a metal compound 20b chemically bonded to the graphene quantum dot 10b may be formed. The graphene quantum dot before this reaction is indicated by 10a and the graphene quantum dot after this reaction is indicated by 10b.

Initially, the graphene quantum dot 10a may include at least one of a hydroxyl group (OH) or a carboxyl group (COOH) as a functional group on its surface. From among carbon atoms constituting an aromatic ring structure, double bonds of some carbon atoms may be broken, thereby leading to the production of sp3 carbon, to which a hydroxyl group (OH) or a carboxyl group (COOH) is bonded. The carbon content of the graphene quantum dot 10a may be in the range of about 50 at % to 80 at % or about 55 at % to 75 at %. Although one graphene quantum dot is illustrated in FIG. 5 for the purpose of convenience, the average carbon content in a large number of graphene quantum dots may be in the range of about 50 at % to about 80 at % or about 55 at % to about 75 at %. As described above, when the graphene quantum dot 10a has an OH group and/or a COOH group and the carbon content of about 80 at % or less, the graphene quantum dot 10a may react well with the metal compound precursor 20a.

The graphene quantum dot 10a may be formed, for example, by a hydrothermal synthesis method. In detail, a graphene quantum dot may be formed by mixing tri-nitropyrene (TNP) with NaOH and $H_2O$ and performing a hydrothermal reaction at a temperature of about 150° C. to about 300° C. The obtained graphene quantum dot may be purified and dried to obtain the graphene quantum dot 10a. However, the method of forming the graphene quantum dot 10a described herein is an example only and may be varied in various ways.

The metal compound precursor 20a may include, for example, at least one of metal alkoxide, metal chloride, or metal chloride hydrate. FIG. 5 shows a non-limiting example where the metal compound precursor 20a is a metal alkoxide, e.g., M—O—R. M represents a metal element, O represents oxygen, and R represents an organic compound. R may be, for example, an alkyl group or the like. Metal alkoxide (M—O—R) may include, for example, metal butoxide or metal isopropoxide, such as zirconium butoxide, zirconium isopropoxide, titanium butoxide, titanium isopropoxide, aluminum butoxide, aluminum isopropoxide, or tungsten isopropoxide. However, these materials, which are described herein as an example of the metal compound precursor 20a, are an example only, and the metal compound precursor 20a is not limited thereto.

The metal alkoxide (M—O—R) may react with the OH and/or COOH groups of the graphene quantum dot 10a to form the metal compound 20b. The reaction may be a kind of sol-gel reaction. Hydrolysis and condensation may occur as the metal alkoxide (M—O—R) reacts with the OH or COOH of the graphene quantum dot 10a, resulting in the formation of the metal compound 20b.

The metal compound 20b may include, for example, a metal oxide. For example, the metal compound 20b may include at least one of zirconium (Zr) oxide, titanium (Ti) oxide, tungsten (W) oxide, or aluminum (Al) oxide. The metal compound 20b may be bonded to the graphene quantum dot 10b by an M—O—C bond or an M—C bond. An M—C bond may be formed by removing oxygen (O) from the M—O—C bond by a heat treatment.

Figure 6:
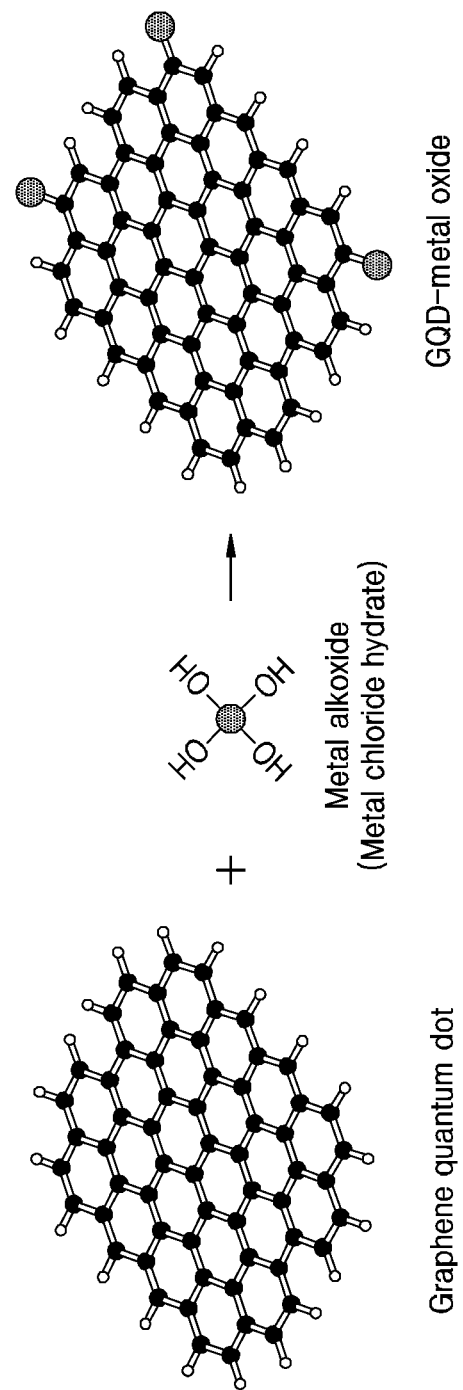
FIG. 6 shows a chemical reaction for explaining a method of producing a hardmask composition according to some example embodiments.

FIG. 6 shows a chemical reaction for explaining a method of producing a hardmask composition according to some example embodiments.

Referring to FIG. 6, a graphene quantum dot is reacted with a metal alkoxide to form a metal oxide chemically bonded to the graphene quantum dot. The metal alkoxide may include, for example, metal butoxide or metal isopropoxide. In one or more embodiments, a metal chloride or a metal chloride hydrate may be used instead of the metal alkoxide.

According to some example embodiments, a graphene quantum dot may be mixed with metal butoxide or metal isopropoxide in a solvent and then heated to induce a sol-gel reaction, thereby producing a metal oxide chemically bonded to the graphene quantum dot.

According to some example embodiments, a graphene quantum dot is mixed with metal butoxide or metal isopropoxide in a solvent and then a hydrothermal reaction is induced, thereby producing a metal oxide chemically bonded to the graphene quantum dot.

According to some example embodiments, a graphene quantum dot is mixed with a metal chloride hydrate in a solvent, and then a hydrothermal reaction is induced, thereby forming a metal oxide chemically bonded to the graphene quantum dot.

In some example embodiments, the graphene quantum dot may be reacted with a precursor of the metal compound. However, according to other example embodiments, the graphene quantum dot may be mixed and reacted with the metal compound (ex. metal oxide). For this purpose, a high-temperature process may be performed at a temperature of about 700° C. to about 1000° C. As a result, a compound (composite material) in which a graphene quantum dot is chemically bonded to the metal compound (ex, metal oxide) may be formed.

FIGS. 7A to 7F are cross-sectional views for explaining how a material film is patterned by using a hardmask composition according to some example embodiments.

Figure 7A:
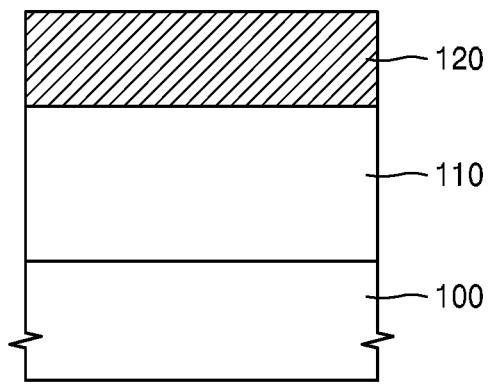
FIGS. 7A to 7F are cross-sectional views for explaining how a material film is patterned by using a hardmask composition according to some example embodiments.

Referring to FIG. 7A, an etch target layer 110 may be formed on a substrate 100. The substrate 100 may be a semiconductor substrate, an insulator substrate, or a conductive substrate. As the substrate 100, various substrates used in semiconductor devices and electronic devices may be used. The etch target layer 110 may be a semiconductor layer, an insulating layer, or a conductive layer. The semiconductor layer may include, for example, Si, Ge, SiGe, GaN, or the like, and the insulating layer may include, for example, $SiO_2$, $Si_xN_y$, SiON, $Al_2O_3$, or the like, and the conductive layer may include metals, alloys, metal compounds, or the like. However, a material for the etch target layer 110 is not limited to these materials. A variety of material layers used in semiconductor devices and electronic devices may be used as the etch target layer 110. The etch target layer 110 may be a part of the substrate 100 or a separate layer distinguishable from the substrate 100. The etch target layer 110 may be referred to as an etch target portion or a patterning target portion.

Next, a hardmask 120 may be formed on the etch target layer 110 by using a hardmask composition according to some example embodiments. The hardmask compositions described with reference to FIGS. 1, 2, and 4 to 6 may be provided on the etch target layer 110, and then, the hardmask 120 may be formed therefrom. Since the hardmask compositions are each a solution composition containing a graphene quantum dot, a metal compound chemically bonded thereto, and a solvent, the hardmask 120 may be formed through a solution process. In detail, the providing of the hardmask composition on the etch target layer 110 may be performed by any one of spin coating, screen printing, doctor-blade processing, spray coating, electrospray, dip coating, or bar coating. After providing (for example, coating) the hardmask composition on the etch target layer 110 by using these methods, the hardmask composition may be heat treated (e.g., dried) at a temperature of about 500° C. or less. Through the heat treatment (drying) process, the solvent may be removed from the hardmask composition, and as a result, the hardmask 120 may be obtained. The hardmask 120 may include graphene quantum dots (GQDs) and a metal compound (e.g., metal oxide) chemically bonded thereto.

The hardmask 120 may have a thickness of about 10 nm to about 500 nm, but is not limited thereto. In one or more embodiments, the thickness of the hardmask 120 may range from about 100 nm to about 450 nm. The hardmask 120 may be formed to have a relatively small thickness, and may have excellent thickness uniformity. In one or more embodiments, the thickness of the hardmask 120 may be equal to or greater than 500 nm. The hardmask 120 may be an electrically insulating layer. For example, the hardmask 120 may have an electrical resistance of $10^6 \Omega$ or higher.

Figure 7B:
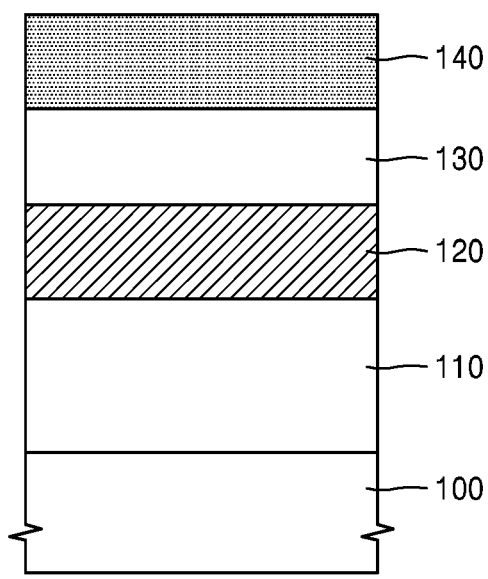

Referring to FIG. 7B, an anti-reflection film 130 may be formed on the hardmask 120, and a resist film 140 may be formed on the anti-reflection film 130. The anti-reflection film 130 may include an inorganic anti-reflection film or an organic anti-reflection film, or a combination thereof. For example, the anti-reflection film 130 may include an inorganic anti-reflection film and an organic anti-reflection film sequentially stacked on the hardmask 120. The inorganic anti-reflection film may include, for example, a silicon oxynitride film (SiON film). The organic anti-reflection film may include a polymer film having an appropriate refractive index and a high absorption coefficient with respect to the exposure wavelength, in association with the resist film 140. Various other anti-reflection materials used in a general lithography process may be used in the inorganic anti-reflection film and the organic anti-reflection film. The thickness of the anti-reflection film 130 may be, for example, in a range from about 100 nm to about 500 nm, but is not limited thereto. The resist film 140 may include a general photoresist (PR) material. In addition, the resist film 140 may include various resin materials.

Figure 7C:
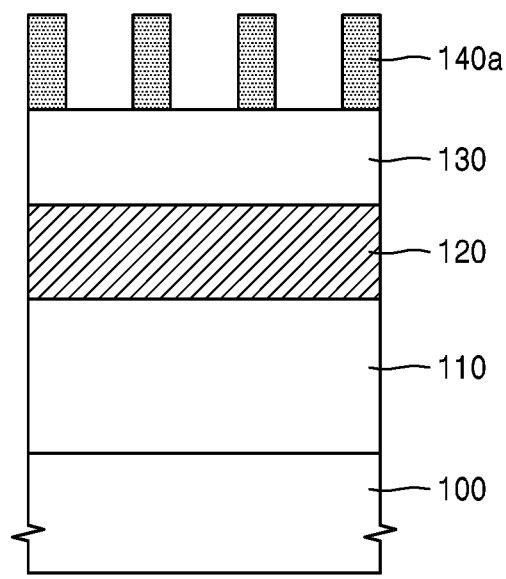

Referring to FIG. 7C, the resist film 140 may be patterned to form a resist pattern 140a. For example, the resist film 140 may be exposed by using an exposure mask, and then, the resultant structure may be developed to form the resist pattern 140a.

Figure 7D:
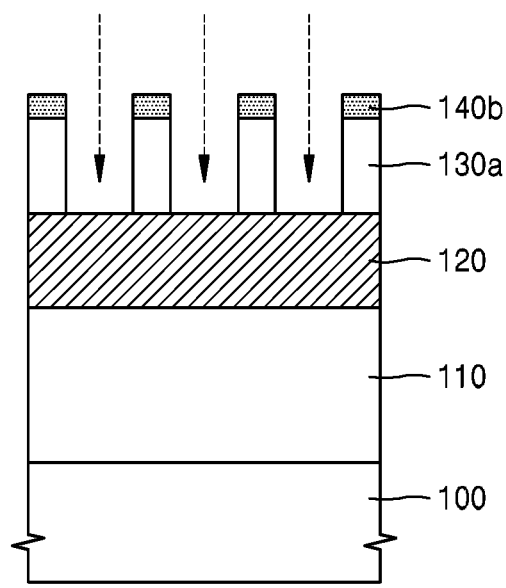

Referring to FIG. 7D, the anti-reflection film 130 may be etched (patterned) by using the resist pattern 140a as an etching mask. The etched (patterned) anti-reflection film is indicated by a reference numeral 130a. When the anti-reflection film 130 is etched (patterned), a part of the resist pattern 140a may be etched (lost). The residual resist pattern is indicated by a reference numeral 140b.

Figure 7E:
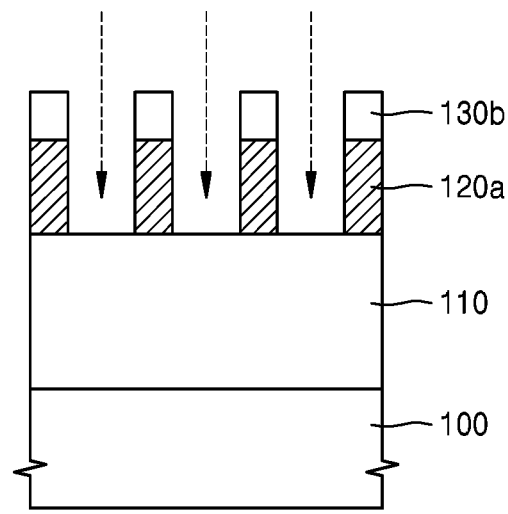

Referring to FIG. 7E, a hardmask pattern 120a may be formed by etching the hardmask 120 by using the residual resist pattern 140b and the patterned anti-reflection film 130a as an etch mask. The process of forming the hardmask pattern 120a by etching the hardmask 120 may be performed by using a dry etching process using oxygen ($O_2$) plasma. In this process, the residual resist pattern 140b may be removed and a part of the patterned anti-reflection film 130a may be etched (lost). The residual anti-reflection film is indicated by a reference numeral 130b.

Figure 7F:
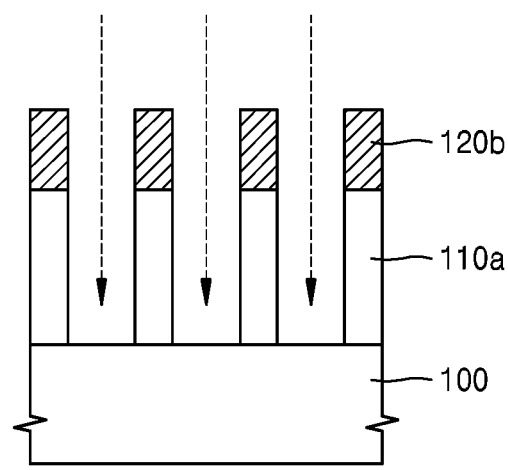

Referring to FIG. 7F, the etch target layer 110 may be etched by using the hardmask pattern 120a as an etch mask to form a patterned material layer, e.g., a patterned layer 110a. In this process, the residual anti-reflection film 130b may be removed. Also, a part of a top portion of the hardmask pattern 120a may be etched. The residual hardmask pattern is denoted by a reference numeral 120b.

The process of etching the etch target layer 110 to form the patterned layer 110a in the process described in connection with FIG. 7F may be performed by a dry etching process using etching gas. The etching gas may include, for example, at least one selected from $CF_X$, $CHF_X$, $Cl_2$, and $BCl_3$. Herein, $CF_X$ may be $CF_4$ and $CHF_X$ may be $CHF_3$. In addition, the etching gas may further include an Ar gas for plasma generation. The etching gas may further include $O_2$ gas. The etching gas may vary according to a material for the etch target layer 110. Examples of etching gas described above are used herein for illustrative purpose only, and the etching gas is not limited thereto.

The residual hardmask pattern 120b has excellent etching resistance and uniformity (composition uniformity and thickness uniformity), and accordingly, the loss or deformation of the residual hardmask pattern 120b may be suppressed, and the patterning of the etch target layer 110 may be easily performed. Therefore, a patterned layer having a high aspect ratio may be obtained. Further, a patterned layer having a fine pattern (ultrafine pattern) of several tens nm or less (e.g., greater than 0 nm and less than or equal to 100 nm, 50 nm, 30 nm) may be obtained. Collapsing of the fine pattern (ultrafine pattern) of the patterned layer 110a or inaccurate formation of the edge portion of a pattern may be suppressed or prevented.

Thereafter, although not shown, the residual hardmask pattern 120b may be removed. For example, the residual hardmask pattern 120b may be removed by an ashing process or a wet etching process. The ashing process may be, for example, an oxygen ($O_2$) plasma ashing process, and the wet etching process may be performed by using, for example, alcohol, acetone, or a mixture of nitric acid and sulfuric acid. However, the method of removing the residual hardmask pattern 120b is not limited thereto, and may be variously changed. According to some example embodiments, the removal of the residual hardmask pattern 120b may be easily performed. Among the conventional hardmask materials, an amorphous carbon layer (ACL) including boron (B) is difficult to be subject to ashing. Accordingly, it is difficult to remove the amorphous carbon layer (ACL) after the patterning process. However, in some example embodiments, the hardmask material may be easily removed by an ashing or a wet etching process.

A pattern/patterned layer formed by using a hardmask composition according to some example embodiments may be used in the fabrication of various semiconductor devices and electronic devices. For example, in some example embodiments, the hardmask composition may be used to form various patterned materials/structures, such as metal wirings, contact holes, via holes, trenches, insulator patterns, semiconductor patterns, and conductor patterns. Using a hardmask obtained from a hardmask composition according to some example embodiments may provide excellent patterning characteristics, and consequently, may lead to a decrease in the line width, high integration and improving the performance of semiconductor devices/electronic devices.

The method of forming the patterned layer 110a described with reference to FIGS. 7A to 7F is an example only, and may be variously modified depending on conditions. For example, the residual resist pattern 140b may be completely removed in the process described in connection with FIG. 7D, and the residual anti-reflection film 130b may be completely removed in the process described in connection with FIG. 7E. In some cases, the anti-reflection film 130 may not be used. In one or more embodiments, the hardmask 120 according to the embodiment may be used for, instead of photolithography, other processes such as E-beam lithography. Furthermore, the method of forming a patterned layer may be variously modified.

Figure 8:
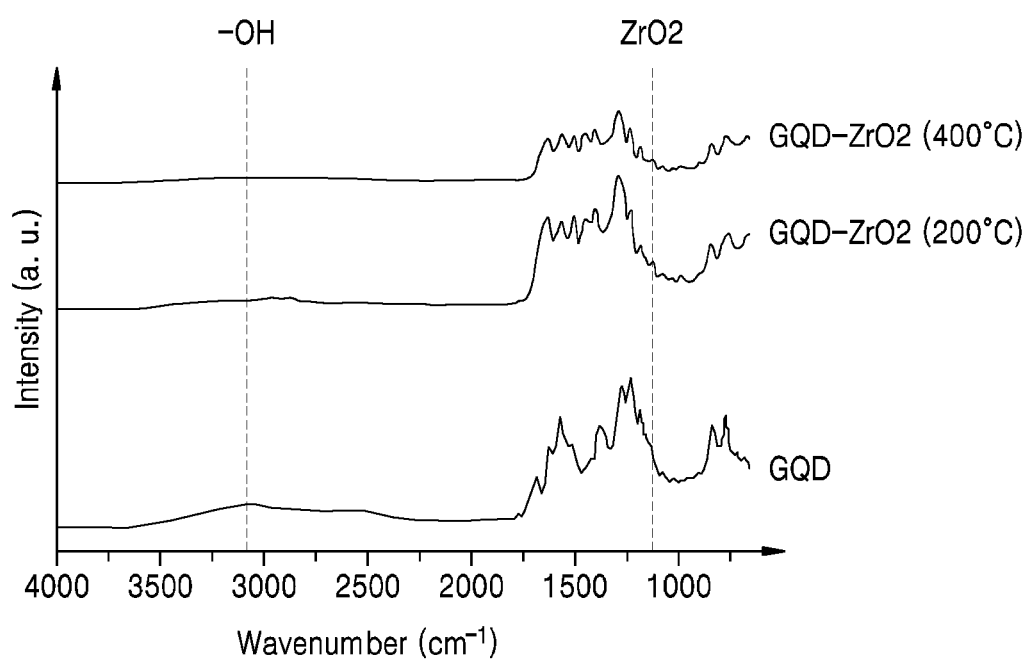
FIG. 8 shows results of Fourier transform infrared (FT-IR) spectroscopy analysis performed on a hardmask material film formed according to some example embodiments.

FIG. 8 shows results of Fourier transform infrared (FT-IR) spectroscopy analysis performed on a hardmask material film formed according to some example embodiments. FIG. 8 includes FT-IR analysis results for a hardmask including $GQD\text{-}ZrO_2$ (200° C.) according to some example embodiments and a hardmask including $GQD\text{-}ZrO_2$ (400° C.) according to some example embodiments. $GQD\text{-}ZrO_2$ is a composite material in which a plurality of GQDs are chemically bonded to a plurality of $ZrO_2$ nanoparticles, and 200° C. and 400° C. are each a heat treatment temperature for the $GQD\text{-}ZrO_2$ material. FIG. 8 also includes FT-IR analysis results for a GQD material film prepared according to Comparative Example.

Referring to FIG. 8, it can be seen that $GQD\text{-}ZrO_2$ (200° C.) material film and $GQD\text{-}ZrO_2$ (400° C.) material film each have a peak corresponding to $ZrO_2$. On the other hand, the GQD material film does not have the peak corresponding to $ZrO_2$. The $GQD\text{-}ZrO_2$ (200° C.) material film and the $GQD\text{-}ZrO_2$ (400° C.) material film do not have a peak corresponding to an OH group, and the GQD material film has the peak corresponding to an OH.

Table 1 below shows the X-ray photoelectron spectroscopy (XPS) analysis results for the GQD material film according to Comparative Example and the $GQD\text{-}ZrO_2$ material film according to Example. The amount of $ZrO_2$ in the $GQD\text{-}ZrO_2$ material film is 7 wt % based on the total weight of GQD and $ZrO_2$.

TABLE 1

|  |  | C1s | N1s | O1s | Zr3d |
|---|---|---|---|---|---|
| Comparative Example | GQD | 81.48 | 2.32 | 16.19 | — |
| Example | $GQD\text{-}ZrO_2$ (7 wt %) | 77.66 | 2.72 | 17.72 | 1.90 |

Referring to Table 1, a peak corresponding to the 3d orbit of Zr appeared in the case of the $GQD\text{-}ZrO_2$ material film, and the peak corresponding to Zr did not appear in the case of the GQD material film. Meanwhile, the C1s/O1s ratio of the $GQD\text{-}ZrO_2$ material film was 77.66/17.72=4.38, and the C1s/O1s ratio of the GQD material film was 81.48/16.19=5.03.

Figure 9:
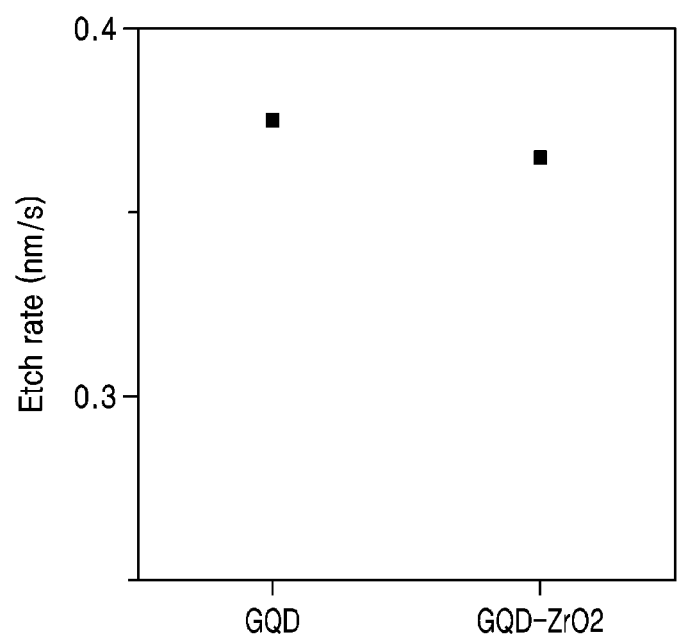
FIG. 9 shows results of an etching test performed on a GQD material film according to Comparative Example and a GQD-$ZrO_2$ material film according to some example embodiments.

FIG. 9 shows results of an etching test performed on a GQD material film according to Comparative Example and a $GQD\text{-}ZrO_2$ material film according to Embodiment. The amount of $ZrO_2$ in the $GQD$-$ZrO_2$ material film is 7 wt % based on the total weight of GQD and $ZrO_2$.

Referring to FIG. 9, the etching rate of the $GQD$-$ZrO_2$ material film is relatively slower than the etching rate of the GQD material film. This shows that the etching resistance of the $GQD$-$ZrO_2$ material film is superior to that of the GQD material film.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims. For example, a metal carbide may be formed instead of or in combination with a metal oxide chemically bonded to a graphene quantum dot. In other words, other materials, such as metal carbide, may be used instead of or in combination with the metal oxide as the metal compound. When a hardmask composition according to some example embodiments is heated to about 300 to 2000° C. in an autoclave, metal carbide may be formed while oxygen (O) is removed from at least a part of the metal oxide. In addition, it will be understood that the method of forming a patterned layer described in connection with FIGS. 7A to 7F may be variously changed. Therefore, the scope of inventive concepts should not be limited by the embodiments described above, but should be determined by the claims.

What is claimed is:

1. A hardmask composition comprising:
   graphene quantum dots;
   a metal compound chemically bonded to the graphene quantum dots; and
   a solvent, wherein
   an amount of the metal compound is greater than 0 wt % and less than or equal to 10 wt %, based on a total weight of the graphene quantum dots and the metal compound.

2. The hardmask composition of claim 1, wherein the metal compound includes a metal oxide.

3. The hardmask composition of claim 2, wherein the metal oxide includes least one of zirconium (Zr) oxide, titanium (Ti) oxide, tungsten (W) oxide, or aluminum (Al) oxide.

4. The hardmask composition of claim 1, wherein the graphene quantum dots are covalently bonded to the metal compound.

5. The hardmask composition of claim 1, wherein
   the graphene quantum dots are bonded to the metal compound via an M—O—C bond or an M—C bond,
   where M is a metal element, O is oxygen, and C is carbon.

6. The hardmask composition of claim 1, wherein a size of the graphene quantum dots is greater than 0 nm and less than or equal to about 10 nm.

7. The hardmask composition of claim 1, wherein the metal compound is in a form of nanoparticles.

8. The hardmask composition of claim 7, wherein the nanoparticles of the metal compound each have a size of greater than 0 nm and less than or equal to 2 nm.

9. The hardmask composition of claim 1, wherein the solvent is an organic solvent.

10. The hardmask composition of claim 1, wherein the solvent includes at least one of N-methylpyrrolidone (NMP), dimethylformamide (DMF), tetrahydrofuran (THF), or propylene glycol methyl ether acetate (PGMEA).

11. A method of forming a patterned layer, the method comprising:
    forming a hardmask pattern on a substrate,
       the substrate including an etch target portion,
       the forming the hardmask pattern including providing the hardmask composition of claim 1 on the substrate, forming a hardmask from the hardmask composition, forming a patterned resist film on the hardmask, and etching the hardmask using the patterned resist film as an etching mask to form the hardmask pattern; and
    forming a patterned layer by etching the etch target portion of the substrate using the hardmask pattern as an etch mask.

12. The method of claim 11, wherein the forming the hardmask pattern includes one of spin coating, screen printing, doctor-blade processing, spray coating, electrospray, dip coating, or bar coating to provide the hardmask composition on the substrate.

13. The method of claim 11, wherein the forming the hardmask pattern includes heat treating the hardmask composition at a temperature of greater than 0° C. and less than or equal to 500° C. after the providing the hardmask composition on the substrate.

14. The method of claim 11, wherein the hardmask has a thickness of about 10 nm to about 500 nm.

15. The method of claim 11, wherein the hardmask is an electrically insulating layer.

16. A method of preparing a hardmask composition, the method comprising:
    adding graphene quantum dots and a precursor of a metal compound to a solvent; and
    forming a metal compound from the precursor in the solvent, the metal compound being chemically bonded to the graphene quantum dots, wherein
    an amount of the metal compound is greater than 0 wt % and less than or equal to 10 wt %, based on a total weight of the graphene quantum dots and the metal compound.

17. The method of claim 16, wherein, before the forming the metal compound chemically bonded to the graphene quantum dots, a carbon content of the graphene quantum dots is in a range of about 50 at % to about 80 at %.

18. The method of claim 16, wherein, before the forming the metal compound chemically bonded to the graphene quantum dots, the graphene quantum dots include at least one of an OH group or a COOH group as a functional group on a surface thereof.

19. The method of claim 16, wherein the precursor of the metal compound includes at least one of a metal alkoxide, a metal chloride, or a metal chloride hydrate.

20. The method of claim 16, wherein the metal compound includes a metal oxide.

21. The method of claim 16, wherein
    the graphene quantum dots are bonded to the metal compound via an M—O—C bond or an M—C bond,
    M is a metal element,
    O is oxygen, and
    C is carbon.

22. The method of claim 16, wherein the solvent is a non-aqueous solvent including an organic solvent.

23. The method of claim 16, wherein the solvent includes at least one of N-methylpyrrolidone (NMP), dimethylformamide (DMF), tetrahydrofuran (THF), or propylene glycol methyl ether acetate (PGMEA).

24. A hardmask composition manufactured by the method of claim 16, wherein
the hardmask composition includes the solvent and the metal compound chemically bonded to the graphene quantum dots, and
the solvent is a non-aqueous solvent including an organic solvent.

25. The hardmask composition of claim 24, wherein
the graphene quantum dots are bonded to the metal compound via an M-O—C bond or an M—C bond,
M is a metal element,
O is oxygen, and
C is carbon.

26. The hardmask composition of claim 24, wherein the precursor of the metal compound includes at least one of a metal alkoxide, a metal chloride, or a metal chloride hydrate.

27. The hardmask composition of claim 24, wherein a size of the graphene quantum dots is greater than 0 nm and less than or equal to about 10 nm.

* * * * *